(12) United States Patent
Song et al.

(10) Patent No.: US 10,833,180 B2
(45) Date of Patent: Nov. 10, 2020

(54) SELF-ALIGNED TUNNELING FIELD EFFECT TRANSISTORS

(71) Applicant: INTERNATIONAL BUSINESS MACHINES CORPORATION, Armonk, NY (US)

(72) Inventors: Yi Song, Albany, NY (US); Junli Wang, Slingerlands, NY (US); Chi-Chun Liu, Altamont, NY (US); Liying Jiang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/157,518

(22) Filed: Oct. 11, 2018

(65) Prior Publication Data

US 2020/0119168 A1    Apr. 16, 2020

(51) Int. Cl.

| H01L 29/66 | (2006.01) |
| H01L 29/205 | (2006.01) |
| H01L 21/306 | (2006.01) |
| H01L 29/51 | (2006.01) |
| H01L 29/78 | (2006.01) |

(Continued)

(52) U.S. Cl.
CPC ...... *H01L 29/66977* (2013.01); *H01L 21/308* (2013.01); *H01L 21/30617* (2013.01); *H01L 29/0847* (2013.01); *H01L 29/205* (2013.01); *H01L 29/517* (2013.01); *H01L 29/66545* (2013.01); *H01L 29/78* (2013.01)

(58) Field of Classification Search
CPC ........... H01L 29/0847; H01L 29/66583; H01L 29/66575; H01L 29/66977; H01L 29/66659; H01L 29/78624; H01L 29/7835; H01L 21/823431; H01L 21/823821; H01L 21/845; H01L 27/0886; H01L 27/0924; H01L 27/1211; H01L 29/41791; H01L 29/66795; H01L 21/0337; H01L 21/0338; H01L 21/3088; H01L 29/6656

See application file for complete search history.

(56) References Cited

U.S. PATENT DOCUMENTS

| 7,700,466 B2 | 4/2010 | Booth, Jr. et al. |
| 8,263,477 B2 | 9/2012 | Bangsaruntip et al. |
| 8,796,733 B2 | 8/2014 | Seabaugh et al. |

(Continued)

FOREIGN PATENT DOCUMENTS

CN    101699617    4/2010

OTHER PUBLICATIONS

J. Ryckaert et al., The Complementary FET (CFET) for CMOS scaling beyond N3, 018 Symposium on VLSI Technology Digest of Technical Papers, Jun. 2018.

(Continued)

*Primary Examiner* — Tuan A Hoang
(74) *Attorney, Agent, or Firm* — Tutunjian & Bitetto, P.C.; Robert Sullivan (57) ABSTRACT

Semiconductor devices and methods of forming the same include forming a doped drain structure having a first conductivity type on sidewalls of an intrinsic channel layer. An opening is etched in a middle of the channel layer. A doped source structure is formed having a second conductivity type in the opening of the channel layer.

20 Claims, 7 Drawing Sheets

(51) Int. Cl.
*H01L 21/308* (2006.01)
*H01L 29/08* (2006.01)

(56) References Cited

U.S. PATENT DOCUMENTS

| | | | |
|---|---|---|---|
| 8,975,123 B2 | 3/2015 | Daley et al. | |
| 9,362,383 B1 * | 6/2016 | Balakrishnan | H01L 29/66795 |
| 9,391,204 B1 * | 7/2016 | Cheng | H01L 21/02576 |
| 9,431,252 B2 | 8/2016 | Zhang | |
| 9,508,597 B1 | 11/2016 | Liu et al. | |
| 9,627,258 B1 * | 4/2017 | Huang | H01L 21/76897 |
| 10,032,911 B2 * | 7/2018 | Then | H01L 21/02433 |
| 2004/0043623 A1 * | 3/2004 | Liu | H01L 21/31122 |
| | | | 438/736 |
| 2015/0200288 A1 * | 7/2015 | Zhang | H01L 29/737 |
| | | | 257/12 |
| 2016/0056278 A1 * | 2/2016 | Avci | H01L 29/785 |
| | | | 257/12 |
| 2016/0293756 A1 | 10/2016 | Liu et al. | |

OTHER PUBLICATIONS

Guangle Zhou et al., Self-aligned InAs/Al0.45GA0.55Sb vertical tunnel FETs, 69th Device Research Conference, Jun. 2011.

\* cited by examiner

SELF-ALIGNED TUNNELING FIELD EFFECT TRANSISTORS

BACKGROUND

Technical Field

The present invention generally relates to field effect transistors and, more particularly, to self-aligned tunneling field effect transistor fabrication with gate lengths that are defined by sidewall image transfer processes.

Description of the Related Art

A tunneling field effect transistor (FET) makes use of quantum tunneling effects for switching. The source-channel-drain structure of a tunneling FET generally has a P+-i-N+ structure, with a p-type semiconductor being formed on one side of an intrinsic semiconductor and an n-type semiconductor being formed on the other side of the intrinsic semiconductor. A gate voltage changes the conduction and valence bands within the intrinsic semiconductor to make electron tunneling likely from the source to the channel and then from the channel to the drain.

SUMMARY

A method of forming a semiconductor device includes forming a doped drain structure having a first conductivity type on sidewalls of an intrinsic channel layer. An opening is etched in a middle of the channel layer. A doped source structure is formed having a second conductivity type in the opening of the channel layer.

A method of forming a semiconductor device includes growing doped drain structures from p-type doped indium arsenide on respective sidewalls of a channel layer formed from indium gallium arsenide over a substrate formed from a material selected from the group consisting of a semi-insulating semiconductor material and a dielectric material. Dummy gates are formed on the channel layer. An opening in the channel layer is anisotropically etched using the dummy gates as a mask to expose the substrate and to form two channel structures. A doped source structure is grown from n-type doped gallium arsenide in the opening of the channel layer on sidewalls of the channel layer exposed by the anisotropic etch. The doped source structure contacts both channel structures, forming two transistor devices that share the doped source structure.

A semiconductor device includes an inner source/drain structure formed from a first semiconductor material with a first conductivity type. Channel structures are disposed at sidewalls of the inner source/drain structure, formed from an intrinsic second semiconductor material. Outer source/drain structures are disposed at sidewalls of the channel structures, formed from a third semiconductor material with a second conductivity type.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide tunneling field effect transistors (FETs) that are formed by a self-aligned fabrication process. Gate lengths below about 20 nm can be achieved to enhance performance and provide for future device scaling. Parasitic resistance is also reduced. The present embodiments furthermore provide the ability to create devices with different materials in the source and drain regions, thereby providing additional flexibility in designing band-gap alignments between the different regions. This is particularly useful for maximizing the tunneling probability.

Tunneling FETs are generally operated by applying a gate voltage to cause electron accumulation in the intrinsic region of the device. Band-to-band tunneling occurs when the conduction band of the intrinsic region approaches the energy level of the p-type region's valence band. The "conduction band" is the lowest lying electron energy band of the doped material that is not completely filled with electrons. Electrons from the p-type region's valence band can then tunnel to the intrinsic region's conduction band, causing a current to flow. The device is turned off when the gate voltage is changed again, either by reducing the voltage and allowing the energy levels in the intrinsic region to approach their normal levels or by further increasing the voltage, pushing the energy levels out of tunneling range.

Tunneling FETs are advantageous in low-power applications, because they are capable of lower drain currents at low voltages, whereas conventional metal-oxide-semiconductor FETs (MOSFETs) have a relatively high sub-threshold current slope of about 63 mV/decade. This represents a fundamental limit to the low-power operation of MOSFETs, which can be avoided through the use of other transistor designs, such as tunneling FETs. By decreasing the current draw at low voltages, the use of tunneling FETs can substantially reduce the overall power requirements for computing devices.

The present embodiments provide a tunneling FET fabrication process that is particularly well-suited to large-scale integration and mass-production. The use of sidewall-image transfer processes creates very short gate lengths, thereby reducing parasitic resistances and improving overall device performance characteristics.

Figure 1:
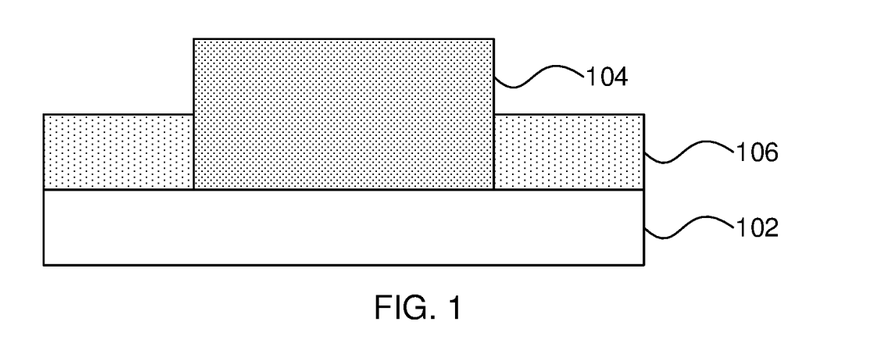
FIG. 1 is a cross-sectional view of a step in the formation of a tunneling field effect transistor (FET) where channel material is formed on a substrate in accordance with an embodiment of the present invention.

Referring now to the drawings in which like numerals represent the same or similar elements and initially to FIG. 1, a step in the self-aligned fabrication of a tunneling FET is shown. A semiconductor channel material 104 is formed on a substrate layer 102. The substrate layer 102 can either be semiconductor or an oxide layer. Shallow-trench isolation regions 106 are formed around the channel material 104 to electrically isolate the region.

It is specifically contemplated that the semiconducting materials described herein are III-V semiconductor materials. The term "III-V semiconductor" denotes a semiconductor material that includes at least one element from Group III of the Periodic Table of Elements (i.e., International Union of Pure and Applied Chemistry (IUPAC) group 13) and at least one element from Group V of the Periodic Table of Elements (i.e., IUPAC group 15). This contrasts to group IV semiconductors which are formed from a single element in group IV of the Periodic Table of Elements (i.e., IUPAC group 14) such as, e.g., silicon, germanium, and compounds thereof. Typically, the III-V compound semiconductors are binary, ternary or quaternary alloys including III/V elements. Examples of III-V compound semiconductors that can be used in the present invention include, but are not limited to alloys of indium phosphide, gallium arsenic, gallium antimonide, aluminum arsenic, indium gallium arsenic, indium aluminum arsenic, indium aluminum arsenic antimony, indium aluminum arsenic phosphorus, indium gallium arsenic phosphorus, cadmium telluride, zinc selenide, and combinations thereof.

It should furthermore be understood that, although the present embodiments are specifically described with respect to III-V semiconductor materials, the present principles may also be applied to group-IV semiconductor materials if the band gap energies are selected or tuned to make tunneling feasible. In certain embodiments, a combination of III-V and group-IV semiconductor structures may be employed.

It is specifically contemplated that a semi-insulating indium phosphide material may be used to form the substrate, but it should be understood that other semiconductor materials or a fully insulating oxide layer may be used instead. A "semi-insulating" semiconductor reflects a semiconductor material that is formed in such a way as to have a low concentration of electrons and holes, resulting in a high resistivity relative to conventional semiconductors. Iridium phosphide is a III-V semiconductor and forms a good base for the epitaxial growth of other III-V semiconductors, but it should be understood that other III-V semiconductors may be used in its place, such as semi-insulating gallium arsenide.

It is specifically contemplated that the semiconductor channel material 104 may be formed from intrinsic indium gallium arsenide. An intrinsic semiconductor, also called an undoped semiconductor or i-type semiconductor, is a pure semiconductor without any significant dopant species present. The number of charge carriers is therefore determined by the properties of the material itself, instead of the amount of impurities. In intrinsic semiconductors the number of excited electrons and the number of holes are equal. Although indium gallium arsenide described herein for the channel material 104, it should be understood that any appropriate intrinsic semiconductor material may be used in its place as long as its band gap energies and the manner in which those band gap energies change in the presence of a gate voltage conform to the demands of a tunneling FET. The semiconductor channel material 104 may be formed on the substrate 102 by, e.g., an epitaxial growth process. If the substrate 102 is a dielectric layer, such as an oxide, the channel material 104 can be formed by a smart cut and wafer bonding process.

The term "epitaxial growth" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The shallow-trench isolation regions 106 may be formed by etching trenches in the semiconductor channel material 104 and then depositing an insulating material in the trenches. It is specifically contemplated that the insulating material may be a silicon oxide, but it should be understood that any appropriate insulator or dielectric material may be used instead. The trenches may be formed by any appropriate anisotropic such as, e.g., a reactive ion etch (RIE).

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 2:
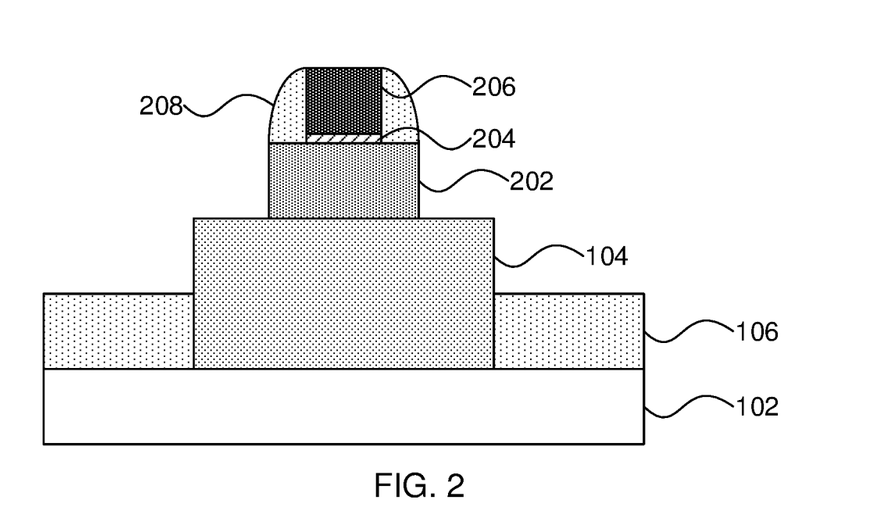
FIG. 2 is a cross-sectional view of a step in the formation of a tunneling FET where dummy gate material is formed on the channel material using a mandrel and mandrel spacers as a mask in accordance with an embodiment of the present invention.

Referring now to FIG. 2, a step in the self-aligned fabrication of a tunneling FET is shown. A dummy gate 202 is formed on the semiconductor channel material 104 and is etched according to a mask made up of a hardmask layer 204, a mandrel 206, and sidewalls 208. It is specifically contemplated that the dummy gate 202 may be formed from any appropriate material, such as polycrystalline silicon, the hardmask layer 204 may be formed from any appropriate material such as silicon nitride, the mandrel 206 may be formed from any appropriate material such as carbon, and the sidewalls 208 may be formed from any appropriate material such as a silicon oxide. These masking structures are formed on a layer of dummy gate material, after which an anisotropic etch is used to remove material that is not covered by the mask.

The thickness of the sidewalls 208 is selected by determining a depth of deposition in any appropriate deposition process, such as chemical vapor deposition (CVD), atomic layer deposition (ALD), or physical vapor deposition (PVD). The material is then removed from horizontal surfaces using an anisotropic etch, leaving behind the material on vertical surfaces. The thickness of the sidewalls 208 determines the ultimate gate length of the device by sidewall image transfer.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface.

Figure 3:
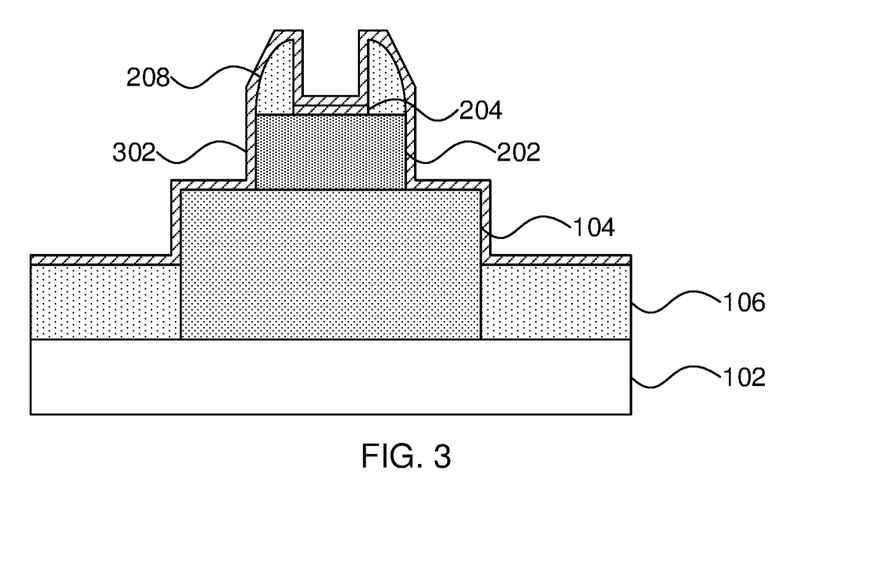
FIG. 3 is a cross-sectional view of a step in the formation of a tunneling FET where the mandrel is etched away and a layer of protective material is deposited in accordance with an embodiment of the present invention.

Referring now to FIG. 3, a step in the self-aligned fabrication of a tunneling FET is shown. The mandrel 206 is etched away, by any appropriate selective etch, and a dielectric liner 302 is deposited. It is specifically contemplated that the dielectric liner 302 may be formed from silicon nitride and may be deposited by any appropriate, conformal deposition process, such as CVD. As used herein, the term "selective" in reference to a material removal process denotes that the rate of material removal for a first material is greater than the rate of removal for at least another material of the structure to which the material removal process is being applied.

Figure 4:
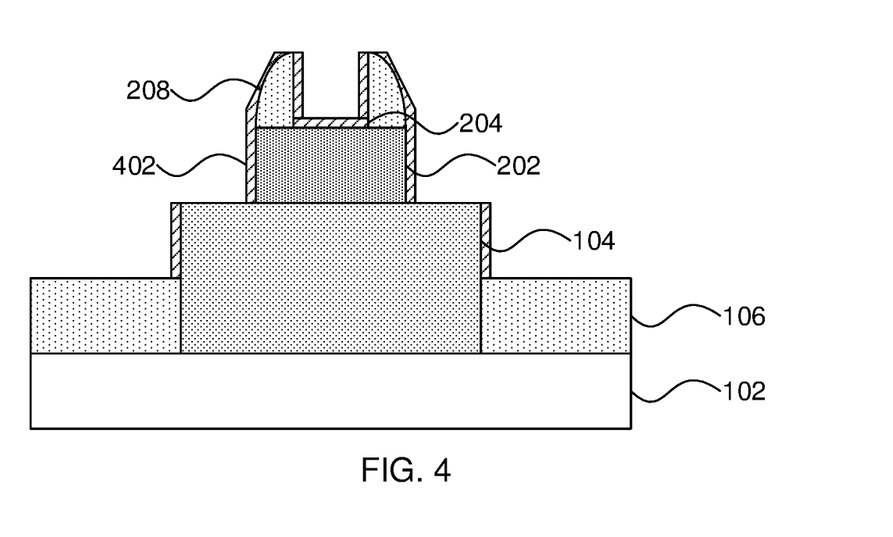
FIG. 4 is a cross-sectional view of a step in the formation of a tunneling FET where the protective material is etched back to expose a top surface of the channel material in accordance with an embodiment of the present invention.

Referring now to FIG. 4, a step in the self-aligned fabrication of a tunneling FET is shown. The liner 302 is etched back using a selective anisotropic etch that leaves sidewalls 402 in place. At this stage, when both p-type and n-type devices are present on a single chip, a first type of device may be masked while the second type of device is processed. The second device(s) can then be masked while the first device(s) are processed. The present processes will be described with respect to a single device type, but it should be understood that both types of device can be fabricated in the same manner on the same chip.

Figure 5:
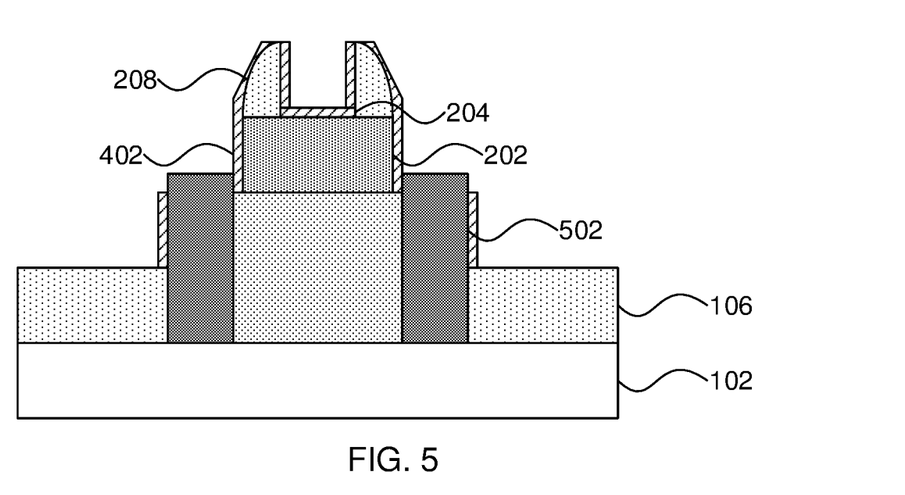
FIG. 5 is a cross-sectional view of a step in the formation of a tunneling FET where the exposed channel material is etched away and source/drain structures are grown in its place in accordance with an embodiment of the present invention.

Referring now to FIG. 5, a step in the self-aligned fabrication of a tunneling FET is shown. Exposed portions of the semiconductor channel material 104 are etched away using a selective anisotropic etch. Drain regions 502 are then epitaxially grown from the exposed sides of the remaining semiconductor channel material 104. It is specifically contemplated that the drain regions 502 may be formed from n-type indium arsenide, though it should again be understood that any appropriate material may be selected with an appropriate band gap energy. In embodiments where a masking layer remains on a top surface of the channel material 104, a separate etch may be used to remove the masking layer and expose the channel material before etching the exposed channel material 104.

As used herein, "n-type" refers to the addition of impurities that contributes free electrons to an intrinsic semiconductor. As used herein, "p-type" refers to the addition of impurities to an intrinsic semiconductor that creates deficiencies of valence electrons. As used herein, the term "conductivity type" denotes a dopant region being p-type or n-type. A III-V semiconductor material may include an n-type dopant (e.g., an element from Group IV or VI of the Periodic Table of Elements) or a p-type dopant (e.g., an element from Group II or VI of the Periodic Table of Elements). The concentration of dopant within the doped region is typically from about $10^{11}$ to about $10^{15}$ atoms/cm$^2$, with a concentration of dopant within the doped region from about $10^{11}$ to about $10^{13}$ atoms/cm$^2$ being more typical. In certain circumstances, group-IV semiconductor atoms can also be used as either p-type or n-type dopants within a III-V semiconductor material.

Figure 6:
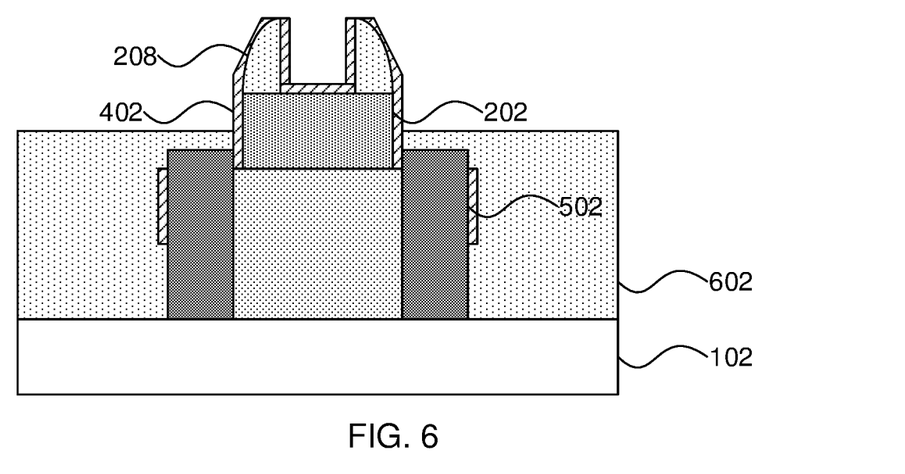
FIG. 6 is a cross-sectional view of a step in the formation of a tunneling FET where a layer of passivating material is deposited in accordance with an embodiment of the present invention.

Referring now to FIG. 6, a step in the self-aligned fabrication of a tunneling FET is shown. Additional dielectric material is deposited over the structures by, e.g., a flowable CVD of silicon oxide, to form support layer 602. The material may be deposited to a height above the spacers 208 and then may be etched back, using any appropriate isotropic or anisotropic etch, to a height that is above the drain structures 502 but below a top surface of the dummy gate 202.

Figure 7:
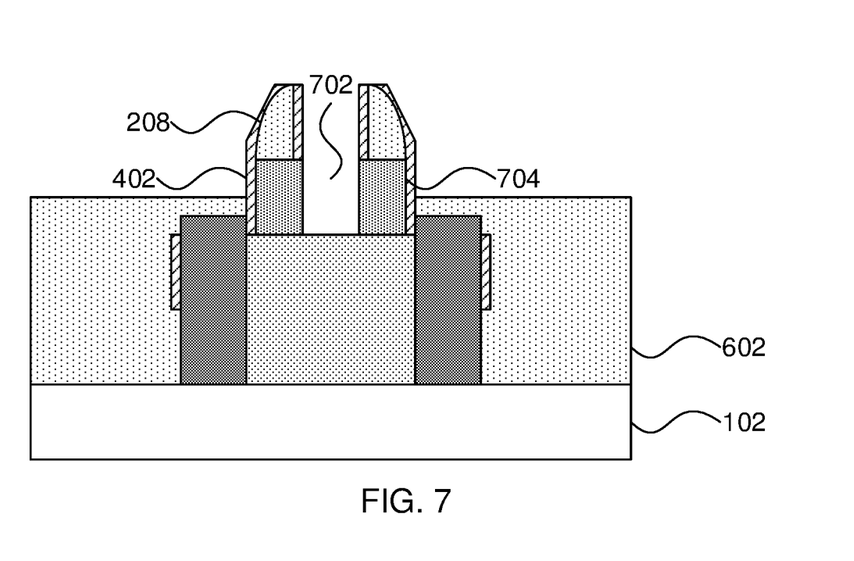
FIG. 7 is a cross-sectional view of a step in the formation of a tunneling FET where the remaining mandrel sidewall spacers are used as a mask to etch the dummy gate material to form dummy gates in accordance with an embodiment of the present invention.

Referring now to FIG. 7, a step in the self-aligned fabrication of a tunneling FET is shown. An opening 702 is formed in the dummy gate 202, leaving two dummy gate structures 704. The liner 402 is etched back further using an anisotropic etch to expose the top surface of the dummy gate 202 between the spacers 208 and a further anisotropic etch is used to remove exposed material from the dummy gate 202. These two etches may be performed separately or, alternatively, may be performed in a single etch process. It should be noted that the etches are selective and do not harm the material of the sidewalls 208 or the support layer 602.

Figure 8:
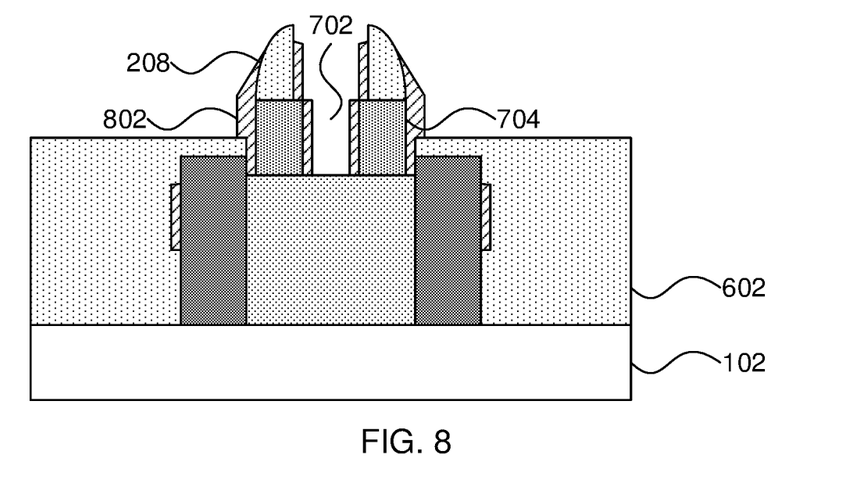
FIG. 8 is a cross-sectional view of a step in the formation of a tunneling FET where additional protective material is deposited on sidewalls of the dummy gates in accordance with an embodiment of the present invention.

Referring now to FIG. 8, a step in the self-aligned fabrication of a tunneling FET is shown. Additional liner material is deposited and then anisotropically etched, leaving behind liner 802 that includes inner sidewalls in the opening 702. A portion of the semiconductor channel material 104 remains exposed at the bottom of the opening 702, between the dummy gates 704.

Figure 9:
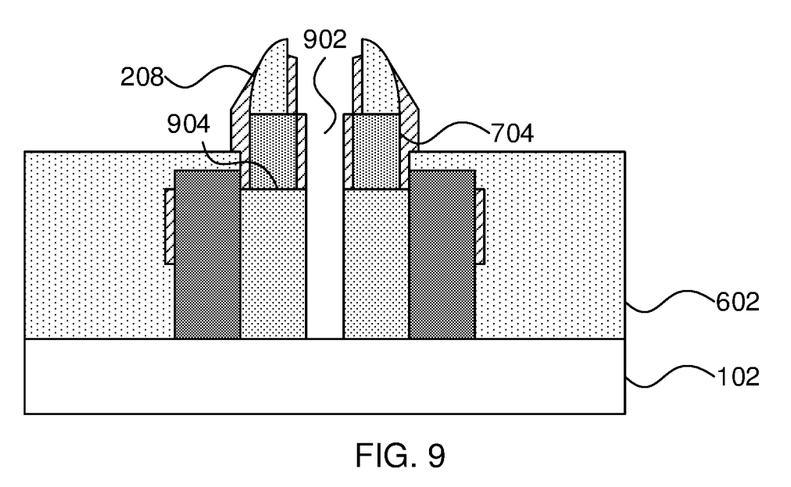
FIG. 9 is a cross-sectional view of a step in the formation of a tunneling FET where the dummy gates are used as a mask to etch down into the channel material and form channel structures in accordance with an embodiment of the present invention.

Referring now to FIG. 9, a step in the self-aligned fabrication of a tunneling FET is shown. A selective anisotropic etch is used to create opening 902 in the semiconductor channel material 104, thereby separating it into two intrinsic semiconductor channel structures 904.

Figure 10:
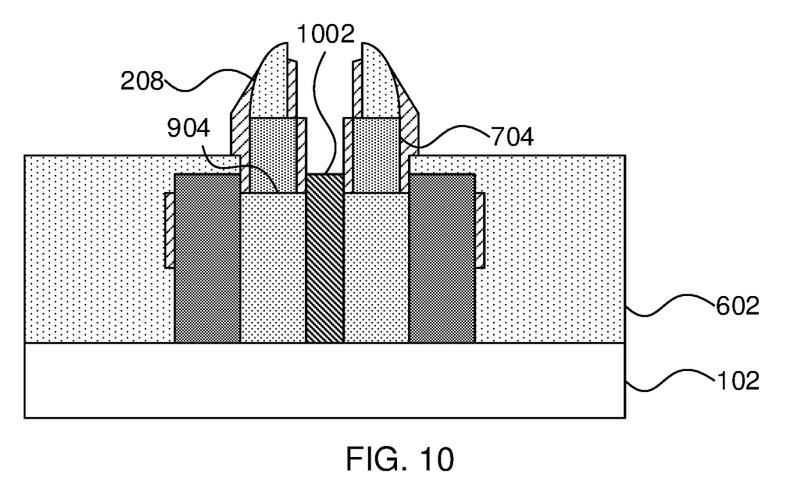
FIG. 10 is a cross-sectional view of a step in the formation of a tunneling FET where an inner source/drain structure is grown from the exposed sidewalls of the channel structures in accordance with an embodiment of the present invention.

Referring now to FIG. 10, a step in the self-aligned fabrication of a tunneling FET is shown. A shared source region 1002 is then epitaxially grown from the exposed sides of the semiconductor channel structures 904. It is specifically contemplated that the source region 1002 may be formed from p-type gallium antimonide, though it should again be understood that any appropriate material may be selected with an appropriate band gap energy.

Figure 11:
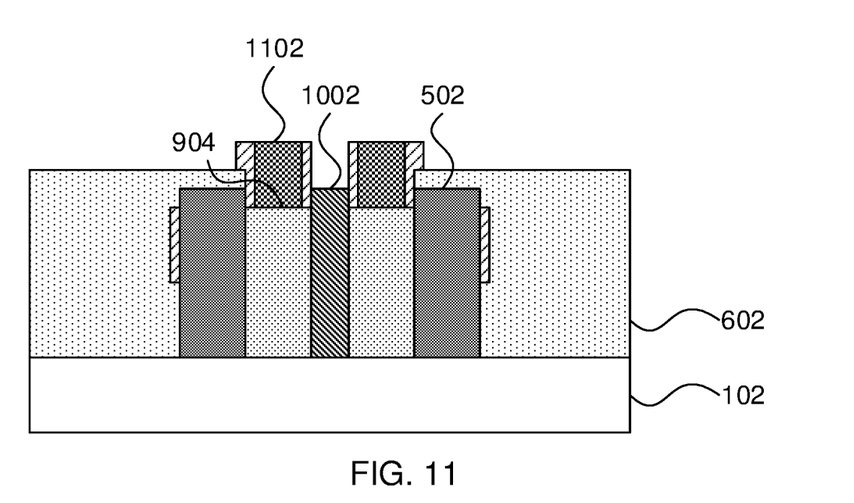
FIG. 11 is a cross-sectional view of a step in the formation of a tunneling FET where the dummy gates are replaced by gate stacks in accordance with an embodiment of the present invention.

Referring now to FIG. 11, a step in the self-aligned fabrication of a tunneling FET is shown. The spacers 208 are etched away, along with any portions of the liner 802 remaining above the dummy gates 704. This may be performed using one or more etches or may, alternatively, be performed with a chemical mechanical planarization (CMP) process that stops on the dummy gates 704. CMP is performed using, e.g., a chemical or granular slurry and mechanical force to gradually remove upper layers of the device. The slurry may be formulated to be unable to dissolve, for example, the dummy gate material, resulting in the CMP process's inability to proceed any farther than that layer.

The dummy gates 704 are etched away using any appropriate etch. Gate stacks 1102 are then formed in their place. The gate stacks 1102 may be formed from, e.g., a gate conductor and a gate dielectric. The gate conductor may be formed from any appropriate conductive metal such as, e.g., tungsten, nickel, titanium, molybdenum, tantalum, copper, platinum, silver, gold, ruthenium, iridium, rhenium, rhodium, and alloys thereof. The gate conductor may alternatively be formed from a doped semiconductor material such as, e.g., doped polysilicon.

The gate dielectric may be formed from any appropriate dielectric material including, e.g., a high-k dielectric material. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

The final structure therefore includes the p-type source region 1002, the intrinsic channel regions 904, and the n-type drain regions 502. Conductive contacts are formed to each to provide electrical connectivity to the tunneling FET.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease f description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing scope of the present concept.

Figure 12:
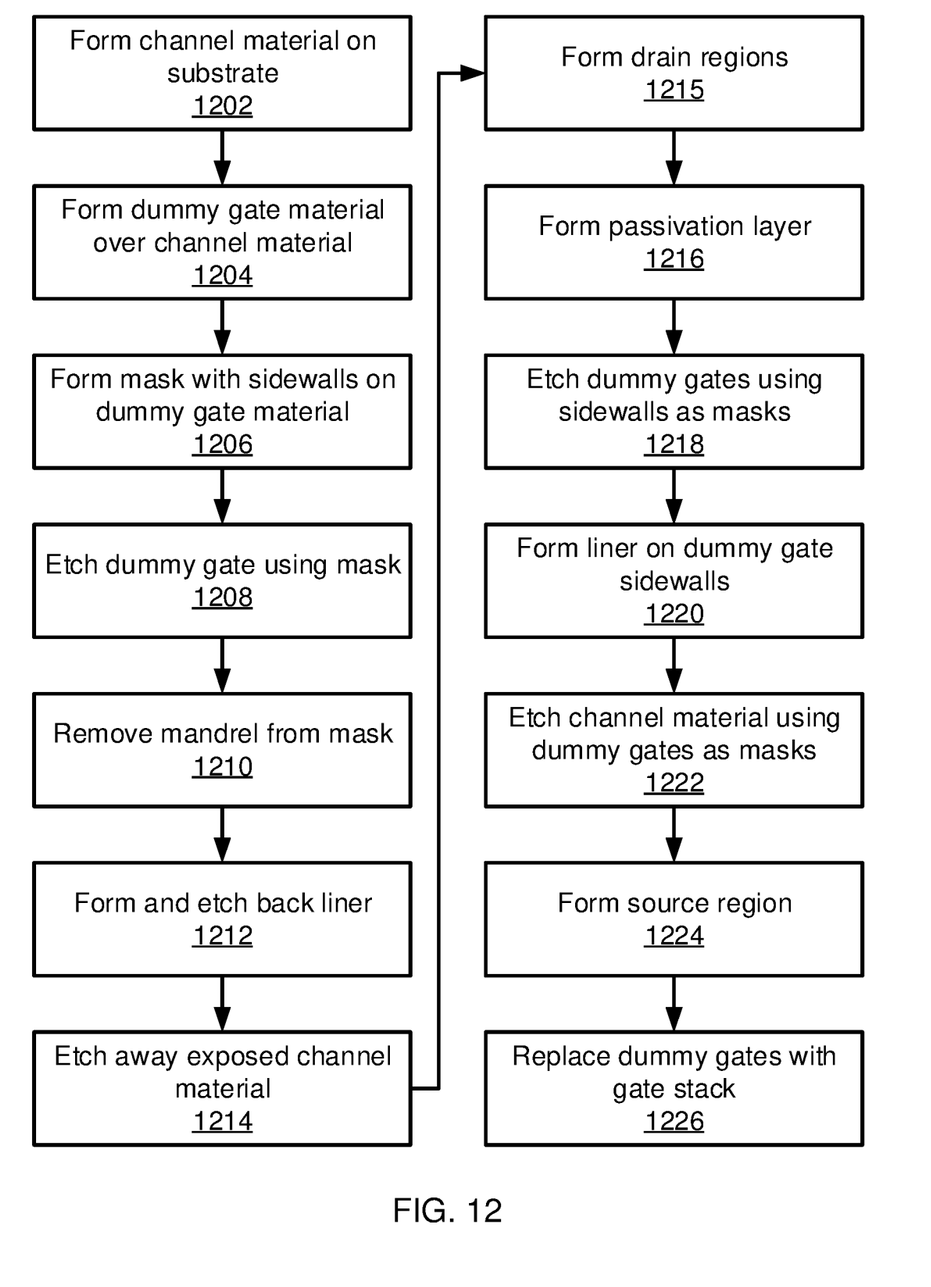
FIG. 12 is a block/flow diagram of a method of forming tunneling FETs in accordance with an embodiment of the present invention.

Referring now to FIG. 12, a method of forming a tunneling FET is shown. Block 1202 forms channel material 104 on substrate 102. The channel material 104 may be formed by any appropriate process including, e.g., epitaxially growing an intrinsic semiconductor from the substrate 102. It is specifically contemplated that the channel material 104 may be formed from undoped indium gallium arsenide that is epitaxially grown from a semi-insulating indium phosphide substrate. Block 1202 then isolates a device region by shallow trench isolation, forming oxide barriers 106.

Block 1204 forms a dummy gate material, such as polycrystalline silicon, over the channel material 104. Block 1206 forms a mask over the dummy gate material, including for example a mandrel 206 and sidewalls 208. Block 1208 forms the dummy gate 202 by etching the dummy gate material around the mask using any appropriate selective anisotropic etch.

Block 1210 removes the mandrel 206 from the mask and block 212 forms a liner 302 from, e.g., silicon nitride, using a conformal deposition process. Block 1212 then etches back the liner 302 from any horizontal surfaces using a selective anisotropic etch. This leaves top surfaces of the semiconductor channel material 104 exposed.

Block 1214 selectively etches away the exposed channel material using an anisotropic etch. Block 1215 then forms drain regions 502 by epitaxial growth from sidewalls of the remaining semiconductor channel material 104. It is specifically contemplated that the drain regions 502 may be formed from an n-type doped indium arsenide, with any appropriate n-type dopant being selected and included in situ during the growth process.

Block 1216 forms passivation layer 602 to a height that covers the drain regions 502. It is specifically contemplated that the passivation layer 602 may be formed from any appropriate dielectric material, with silicon oxides being specifically contemplated. Block 1218 etches the dummy gate 202 into separate dummy gates 702, using the sidewalls 208 as a mask. Block 1220 then forms a liner on the exposed inner surfaces of the dummy gates 702.

Block 1222 anisotropically etches the semiconductor channel material 104 using the dummy gates 702 as masks to form channel regions 904 with a gap 902 between them. Block 1224 epitaxially grows a shared source region 1002 between the channel regions 904. It is specifically contemplated that the source region 1002 may be formed from a p-type doped gallium antimonide semiconductor and that the structure may be doped in situ with any appropriate p-type dopant being selected.

Block 1226 then replaces the dummy gates 704 with gate stacks 1102. The dummy gates 704 may be etched away with any appropriate selective etch. A gate dielectric is deposited first with a conformal deposition process, followed by the deposition of a gate conductor. Any excess material may be removed using a CMP process. The final device can be accessed by forming electrical contacts to the source, gates, and drains structures.

Having described preferred embodiments of self-aligned tunneling field effect transistors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device, comprising:
   forming a doped drain structure having a first conductivity type on sidewalls of an intrinsic channel layer;
   forming mandrel sidewalls over a dummy gate layer;
   forming a dummy gate from the dummy gate layer, using the mandrel sidewalls as a mask, the dummy gate having a central opening that exposes a portion of the channel layer;
   forming an opening in a middle of the channel layer after forming the doped drain structure, using the dummy gate as a mask;
   forming a doped source structure having a second conductivity type in the opening of the channel layer.

2. The method of claim 1, wherein forming the doped drain structure and the doped source structure comprises respective epitaxial growth processes that grow said structures from the channel layer.

3. The method of claim 1, further comprising forming the dummy gate layer on the channel layer before forming the doped drain structure.

4. The method of claim 3, further comprising forming a mandrel on the dummy gate layer, before forming the mandrel sidewalls, and anisotropically etching the dummy gate layer around the mandrel and mandrel sidewalls.

5. The method of claim 4, wherein forming the opening in the middle of the channel layer comprises removing the mandrel from between the mandrel sidewalls and anisotropically etching the channel layer, using the dummy gate as a mask.

6. The method of claim 5, further comprising forming a gate stack on the channel layer by etching away the sidewalls and the dummy gate and depositing a gate dielectric and a gate conductor.

7. The method of claim 3, wherein forming the doped source structure comprises forming the doped source structure on sidewalls of the channel layer exposed by an anisotropic etch used to form the opening.

8. The method of claim 1, wherein forming the doped drain structure comprises forming two such doped drain structures on respective sides of the channel layer.

9. The method of claim 1, wherein the doped drain structure is formed from n-type doped indium arsenide, the channel layer is formed from intrinsic indium gallium arsenide, and the doped source structure is formed from p-type doped gallium antimonide.

10. The method of claim 1, wherein the doped drain structure, the intrinsic channel layer, and the doped source structure are formed on a substrate formed from a material selected from the group consisting of a semi-insulating semiconductor material and a dielectric material.

11. The method of claim 1, wherein forming the opening in the middle of the channel layer comprises anisotropically etching the opening, wherein the mask further comprises spacer structures formed over the dummy gate.

12. A method of forming a semiconductor device, comprising:
    forming a first masking structure over a layer of indium gallium arsenide, the masking structure including a dummy gate layer and spacer structures over the dummy gate layer;
    etching the layer of indium gallium arsenide to remove material around the masking structure and to form a channel layer thereby;
    growing doped drain structures from n-type doped indium arsenide on respective sidewalls of the channel layer, over a substrate formed from a material selected from the group consisting of a semi-insulating semiconductor material and a dielectric material;
    anisotropically etching an opening in the dummy gate layer, using the spacer structures as a mask, to form dummy gates;
    anisotropically etching an opening in the channel layer using the dummy gates as a mask to expose the substrate and to form two channel structures;
    growing a doped source structure from p-type doped gallium arsenide in the opening of the channel layer on sidewalls of the channel layer exposed by the anisotropic etch, wherein the doped source structure contacts both channel structures, forming two transistor devices that share the doped source structure.

13. The method of claim 12, wherein forming the dummy gates comprises forming a mandrel with the sidewall structures on a layer of dummy gate material and anisotropically etching the dummy gate material around the mandrel and spacer structures.

14. The method of claim 13, wherein etching the opening in the middle of the channel layer comprises removing the mandrel from between the spacer structures.

15. The method of claim 14, further comprising forming a gate stack on the channel layer by etching away the spacer structures and the dummy gates and depositing a gate dielectric and a gate conductor.

16. A method of forming a semiconductor device, comprising:
    forming a mask over an intrinsic semiconductor layer, the mask including a dummy gate layer and spacer structures over the dummy gate layer;
    etching the semiconductor layer to remove semiconductor material around the mask and to form a channel layer thereby;
    forming a doped drain structure having a first conductivity type on sidewalls of the channel layer;
    etching an opening in the dummy gate layer, using the spacer structures as a mask, to form dummy gates;
    etching an opening in a middle of the channel layer, using the dummy gates as a mask; and
    forming a doped source structure having a second conductivity type in the opening of the channel layer.

17. The method of claim 16, further comprising forming a dielectric liner on sidewalls of the spacer structures, the dummy gate layer, and the channel layer.

18. The method of claim 17, wherein etching the opening in the dummy gate layer further comprises using the dielectric liner on the sidewalls of the spacer structures as part of the mask.

19. The method of claim 16, further comprising forming a dielectric liner on sidewalls of the dummy gates.

20. The method of claim 19, wherein etching the opening in the middle of the channel layer further comprises using the dielectric liner on the sidewalls of the dummy gates as part of the mask.

* * * * *